(12) United States Patent
Imaoka

(10) Patent No.: US 7,122,909 B2
(45) Date of Patent: Oct. 17, 2006

(54) WIRING BOARD, STACKED WIRING BOARD AND METHOD OF MANUFACTURING THE SAME, SEMICONDUCTOR DEVICE AND METHOD OF MANUFACTURING THE SAME, CIRCUIT BOARD, AND ELECTRONIC INSTRUMENT

(75) Inventor: Norio Imaoka, Takamori-machi (JP)

(73) Assignee: Seiko Epson Corporation, Tokyo (JP)

( * ) Notice: Subject to any disclaimer, the term of this patent is extended or adjusted under 35 U.S.C. 154(b) by 177 days.

(21) Appl. No.: 10/856,997

(22) Filed: Jun. 1, 2004

(65) Prior Publication Data
US 2005/0012213 A1    Jan. 20, 2005

(30) Foreign Application Priority Data
Jun. 2, 2003    (JP)    ............................. 2003-156483

(51) Int. Cl.
H01L 23/48    (2006.01)
H01L 23/52    (2006.01)
H01L 29/40    (2006.01)

(52) U.S. Cl. ...................... 257/786; 257/779; 257/780; 257/781; 438/612; 438/613

(58) Field of Classification Search ................ 257/779, 257/781, 786, 780; 228/180.21, 180.22; 438/612, 613
See application file for complete search history.

(56) References Cited

U.S. PATENT DOCUMENTS

| | | | | |
|---|---|---|---|---|
| 3,302,157 A | * | 1/1967 | Olson | .......................... 439/85 |
| 6,137,064 A | * | 10/2000 | Kiani et al. | .................. 174/266 |
| 6,370,032 B1 | * | 4/2002 | DiStefano et al. | .......... 361/760 |
| 6,613,662 B1 | * | 9/2003 | Wark et al. | .................. 438/613 |
| 2003/0022558 A1 | | 1/2003 | Imaoka | |

FOREIGN PATENT DOCUMENTS

JP    A 2003-46212    2/2003

* cited by examiner

Primary Examiner—Zandra V. Smith
Assistant Examiner—Thanh Y. Tran
(74) Attorney, Agent, or Firm—Oliff & Berridge, PLC (57) ABSTRACT

A wiring board has a substrate and an interconnect pattern formed on the substrate. The interconnect pattern includes a plurality of lands. Each of the lands includes a base section and an additional section extending from the base section, the base section of each of the lands having the same shape. When a spiral curve is rotated around an origin and disposed to pass over the base section, the additional section is formed to extend from the base section of any one of the lands in a direction along the spiral curve.

19 Claims, 8 Drawing Sheets

PRIOR ART

WIRING BOARD, STACKED WIRING BOARD AND METHOD OF MANUFACTURING THE SAME, SEMICONDUCTOR DEVICE AND METHOD OF MANUFACTURING THE SAME, CIRCUIT BOARD, AND ELECTRONIC INSTRUMENT

Japanese Patent Application No. 2003-156483, filed on Jun. 2, 2003, is hereby incorporated by reference in its entirety.

BACKGROUND OF THE INVENTION

The present invention relates to a wiring board, a stacked wiring board and a method of manufacturing the same, a semiconductor device and a method of manufacturing the same, a circuit board, and an electronic instrument.

Figure 11A:
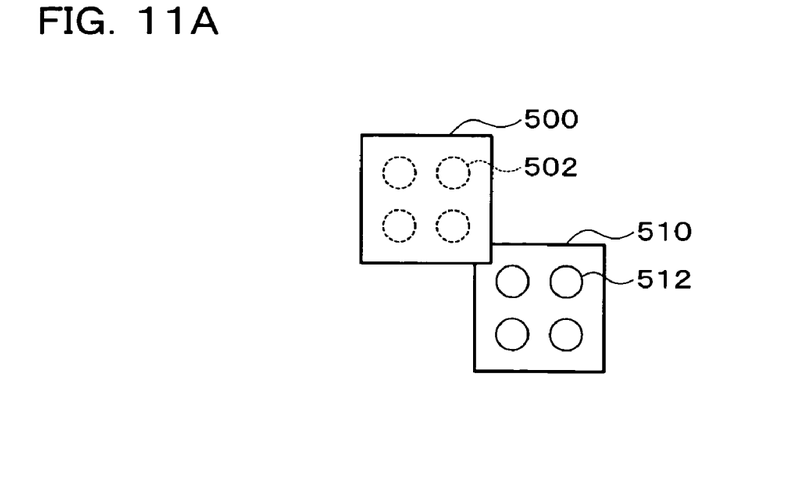
FIGS. 11A to 11C are illustrative of positioning of a conventional semiconductor device and a wiring board.
Figure 11B:
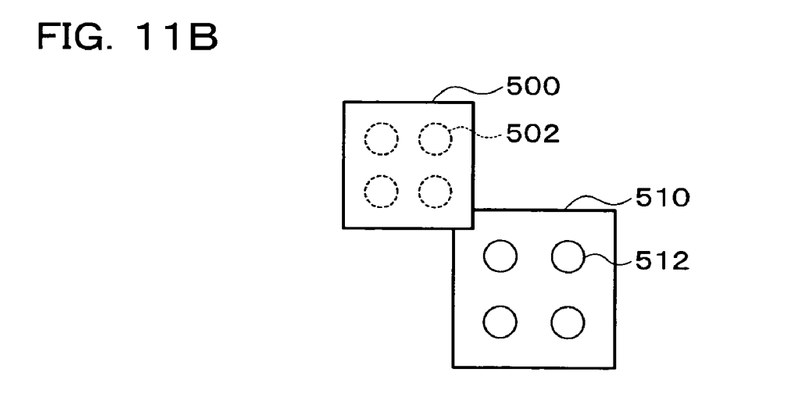
Figure 11C:
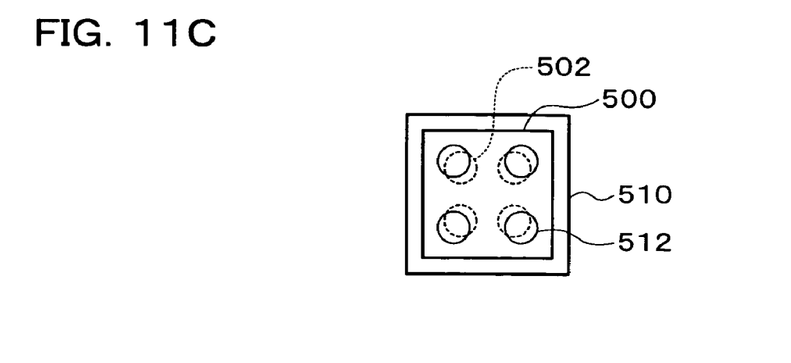

In the case of bonding a semiconductor chip face-down to a substrate, positioning of bumps of the semiconductor chip and lands of the substrate is important. As shown in FIG. 11A, a semiconductor chip 500 and a substrate 510 are designed so that the position of a bump 502 and a land 512 are coincided. The substrate 510 is formed of a resin or the like, and tends to expand or contract in comparison with a semiconductor. If the substrate 510 expands as shown in FIG. 11B, the position of the land 512 is moved. As a result, the position of the bump 502 and the land 512 cannot be positioned as shown in FIG. 11C.

BRIEF SUMMARY OF THE INVENTION

A wiring board according to a first aspect of the present invention includes:

a substrate; and an interconnect pattern formed on the substrate, wherein the interconnect pattern includes a plurality of lands, wherein each of the lands includes a base section and an additional section extending from the base section, the base section of each of the lands having the same shape, and wherein, when a spiral curve is rotated around an origin and disposed to pass over the base section, the additional section is formed to extend from the base section of any one of the lands in a direction along the spiral curve.

A stacked wiring board according to a second aspect of the present invention includes:

a plurality of stacked substrates; and a plurality of interconnect patterns formed on the plurality of substrates, respectively, wherein the plurality of substrates include first and second substrates, wherein the plurality of interconnect patterns include a first interconnect pattern which includes a plurality of first lands formed on the first substrate, and a second interconnect pattern which includes a plurality of second lands formed on the second substrate, wherein each of the first lands faces one of the second lands and is electrically connected with one of the second lands, wherein each of the first lands includes a base section and an additional section extending from the base section, the base section of each of the lands having the same shape, and wherein, when a spiral curve is rotated around an origin and disposed to pass over the base section, the additional section is formed to extend from the base section of any one of the first lands in a direction along the spiral curve.

A semiconductor device according to a third aspect of the present invention includes:

a substrate on which an interconnect pattern including a plurality of lands is formed; and a semiconductor chip which is mounted on the substrate and includes a plurality of electrodes, wherein each of the electrodes faces one of the lands and is electrically connected with one of the lands, wherein each of the lands includes a base section and an additional section extending from the base section, the base section of each of the lands having the same shape, and wherein, when a spiral curve is rotated around an origin and disposed to pass over the base section, the additional section is formed to extend from the base section of any one of the lands in a direction along the spiral curve.

A circuit board according to a fourth aspect of the present invention has the above semiconductor device mounted thereon.

An electronic instrument according to a fifth aspect of the present invention includes the above stacked wiring board.

An electronic instrument according to a sixth aspect of the present invention includes the above semiconductor device.

A method of manufacturing a stacked wiring board according to a seventh aspect of the present invention includes:

positioning a first substrate, on which a first interconnect pattern including a plurality of first lands is formed, and a second substrate, on which a second interconnect pattern including a plurality of second lands is formed, so that each of the first lands faces one of the second lands; and electrically connecting each of the first lands with one of the second lands, wherein each of the first lands includes a base section and an additional section extending from the base section, the base section of each of the lands having the same shape, and wherein, when a spiral curve is rotated around an origin and disposed to pass over the base section, the additional section is formed to extend from the base section of any one of the first lands in a direction along the spiral curve, wherein the base section of each of the first lands and each of the second lands are formed according to the same arrangement pattern on design, wherein the first and second substrates are provided with reference points which coincide with the origin on design, and wherein, in the step of positioning the first and second substrates, the first and second substrates are disposed so that the reference points coincide and relatively rotated around the origin.

A method of manufacturing a semiconductor device according to a eighth aspect of the present invention includes:

positioning a substrate, on which an interconnect pattern including a plurality of lands is formed, and a semiconductor chip including a plurality of electrodes so that each of the lands faces each of the electrodes; and electrically connecting each of the lands with one of the electrodes, wherein each of the lands includes a base section and an additional section extending from the base section, the base section of each of the lands having the same shape, and wherein, when a spiral curve is rotated around an origin and disposed to pass over the base section, the additional section is formed to extend from the base section of any one of the lands in a direction along the spiral curve, wherein the base section of each of the lands and each of the electrodes are formed according to the same arrangement pattern on design, wherein the substrate and the semiconductor chip are provided with reference points which coincide with the origin on design, and wherein, in the step of positioning the substrate and the semiconductor chip, the substrate and the semiconductor chip are disposed so that the reference points coincide, and relatively rotated around the origin.

DETAILED DESCRIPTION OF THE EMBODIMENT

Embodiments of the present invention may enable easy positioning.

(1) A wiring board according to a first embodiment of the present invention includes:

a substrate; and an interconnect pattern formed on the substrate, wherein the interconnect pattern includes a plurality of lands, wherein each of the lands includes a base section and an additional section extending from the base section, the base section of each of the lands having the same shape, and wherein, when a spiral curve is rotated around an origin and disposed to pass over the base section, the additional section is formed to extend from the base section of any one of the lands in a direction along the spiral curve.

According to this wiring board, since the land includes the additional section extending in the direction along the spiral curve, positioning of the land can be implemented by relatively rotating the substrate even if the substrate expands or contracts.

(2) With this wiring board, the spiral curve may be drawn by rotating a moving point from a starting point around the origin so that a distance from the origin is proportional to a rotation angle of the moving point from the starting point.

(3) With this wiring board, the additional section of each of the lands may have a length proportional to the rotation angle of the moving point from the starting point.

(4) With this wiring board, the additional section may be formed on each of two sides of the base section along the spiral curve.

(5) A stacked wiring board according to a second embodiment of the present invention includes:

a plurality of stacked substrates; and a plurality of interconnect patterns formed on the plurality of substrates, respectively, wherein the plurality of substrates include first and second substrates, wherein the plurality of interconnect patterns include a first interconnect pattern which includes a plurality of first lands formed on the first substrate, and a second interconnect pattern which includes a plurality of second lands formed on the second substrate, wherein each of the first lands faces one of the second lands and is electrically connected with one of the second lands, wherein each of the first lands includes a base section and an additional section extending from the base section, the base section of each of the lands having the same shape, and wherein, when a spiral curve is rotated around an origin and disposed to pass over the base section, the additional section is formed to extend from the base section of any one of the first lands in a direction along the spiral curve.

According to this wiring board, since the first land includes the additional section extending in the direction along the spiral curve, positioning of the first and second lands can be implemented by relatively rotating the first and second lands even if the first or second land expands or contracts.

(6) With this stacked wiring board, the spiral curve may be drawn by rotating a moving point from a starting point around the origin so that a distance from the origin is proportional to a rotation angle of the moving point from the starting point.

(7) With this stacked wiring board, the additional section of each of the lands may have a length proportional to the rotation angle of the moving point from the starting point.

(8) With this stacked wiring board, the additional section may be formed on each of two sides of the base section along the spiral curve.

(9) A semiconductor device according to a third embodiment of the present invention includes:

a substrate on which an interconnect pattern including a plurality of lands is formed; and a semiconductor chip which is mounted on the substrate and includes a plurality of electrodes, wherein each of the electrodes faces one of the lands and is electrically connected with one of the lands, wherein each of the lands includes a base section and an additional section extending from the base section, the base section of each of the lands having the same shape, and wherein, when a spiral curve is rotated around an origin and disposed to pass over the base section, the additional section is formed to extend from the base section of any one of the lands in a direction along the spiral curve.

According to this wiring board, since the land includes the additional section extending in the direction along the spiral curve, positioning of the land and the electrode can be implemented by relatively rotating the substrate and the semiconductor chip even if the substrate or the semiconductor chip expands or contracts.

(10) With this semiconductor device, the spiral curve may be drawn by rotating a moving point from a starting point around the origin so that a distance from the origin is proportional to a rotation angle of the moving point from the starting point.

(11) With this semiconductor device, the additional section of each of the lands may have a length proportional to the rotation angle of the moving point from the starting point.

(12) With this semiconductor device, the additional section may be formed on each of two sides of the base section along the spiral curve.

(13) A circuit board according to a fourth embodiment of the present invention have the above semiconductor device mounted thereon.

(14) An electronic instrument according to a fifth embodiment of the present invention includes the above stacked wiring board.

(15) An electronic instrument according to a sixth embodiment of the present invention includes the above semiconductor device.

(16) A method of manufacturing a stacked wiring board according to the seventh embodiment of the present invention includes:

positioning a first substrate, on which a first interconnect pattern including a plurality of first lands is formed, and a second substrate, on which a second interconnect pattern including a plurality of second lands is formed, so that each of the first lands faces one of the second lands; and electrically connecting each of the first lands with one of the second lands, wherein each of the first lands includes a base section and an additional section extending from the base section, the base section of each of the lands having the same shape, and wherein, when a spiral curve is rotated around an origin and disposed to pass over the base section, the additional section is formed to extend from the base section of any one of the first lands in a direction along the spiral curve, wherein the base section of each of the first lands and each of the second lands are formed according to the same arrangement pattern on design, wherein the first and second substrates are provided with reference points which coincide with the origin on design, and wherein, in the step of positioning the first and second substrates, the first and second substrates are disposed so that the reference points coincide and relatively rotated around the origin.

According to this wiring board, since the first land includes the additional section extending in the direction along the spiral curve, positioning of the first and second lands can be implemented by relatively rotating the first and second lands even if the first or second land expands or contracts.

(17) With this method of manufacturing a stacked wiring board, in the step of positioning the first and second substrates, the first and second substrates may become relatively larger or smaller due to expansion or contraction of at least one of the first and second substrates, and one of the first and second substrates which has become relatively smaller may be relatively rotated in a direction toward the origin of the spiral curve.

(18) A method of manufacturing a semiconductor device according to an eighth embodiment of the present invention includes:

positioning a substrate, on which an interconnect pattern including a plurality of lands is formed, and a semiconductor chip including a plurality of electrodes so that each of the lands faces each of the electrodes; and electrically connecting each of the lands with one of the electrodes, wherein each of the lands includes a base section and an additional section extending from the base section, the base section of each of the lands having the same shape, and wherein, when a spiral curve is rotated around an origin and disposed to pass over the base section, the additional section is formed to extend from the base section of any one of the lands in a direction along the spiral curve, wherein the base section of each of the lands and each of the electrodes are formed according to the same arrangement pattern on design, wherein the substrate and the semiconductor chip are provided with reference points which coincide with the origin on design, and wherein, in the step of positioning the substrate and the semiconductor chip, the substrate and the semiconductor chip are disposed so that the reference points coincide, and relatively rotated around the origin.

According to this wiring board, since the land includes the additional section extending in the direction along the spiral curve, positioning of the land and the electrode can be implemented by relatively rotating the substrate and the semiconductor chip even if the substrate or the semiconductor chip expands or contracts.

(19) With this method of manufacturing a stacked wiring board, in the step of positioning the substrate and the semiconductor chip, the substrate and the semiconductor chip may become relatively larger or smaller due to expansion or contraction of at least one of the first and second substrates, and one of the first and second substrates which may have become relatively smaller is relatively rotated in a direction toward the origin of the spiral curve.

The embodiments of the present invention are described below with reference to the drawings.

Figure 1A:
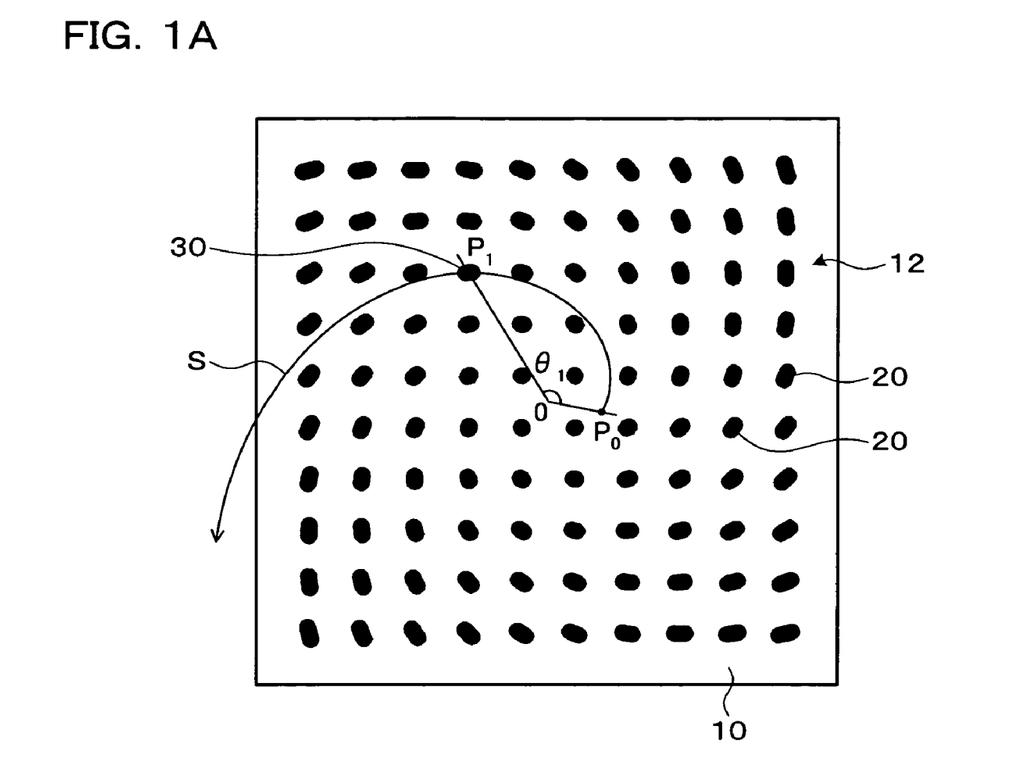
FIGS. 1A and 1B are illustrative of a wiring board according to an embodiment of the present invention.
Figure 2A:
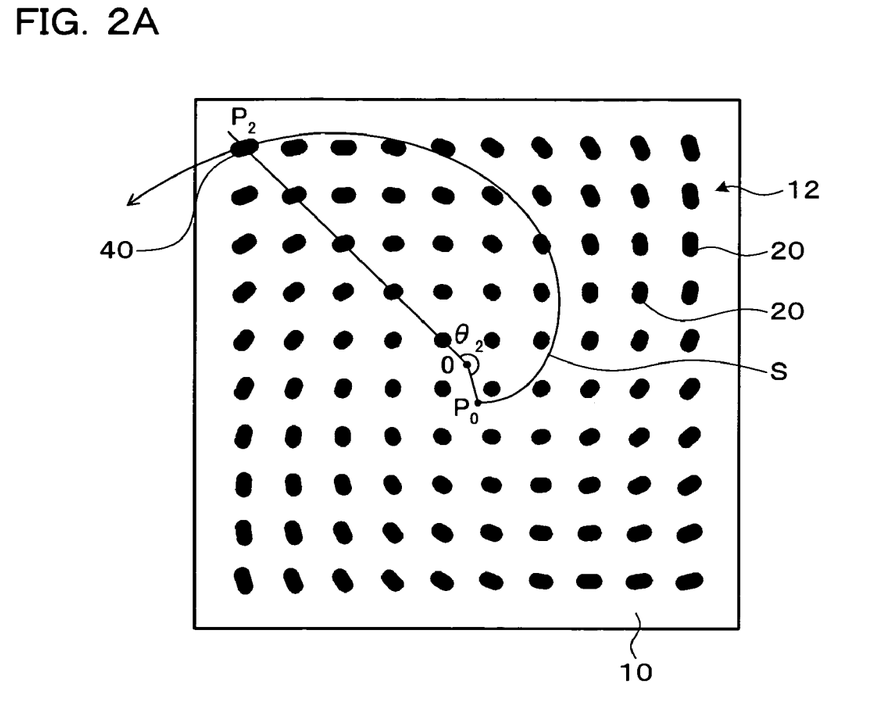
FIGS. 2A and 2B are illustrative of a wiring board according to an embodiment of the present invention.

FIGS. 1A and 2A show a wiring board according to an embodiment of the present invention. The wiring board according to the embodiment of the present invention includes a substrate 10. The substrate 10 may be a flexible substrate or a rigid substrate. The substrate 10 may be formed of an organic material or an inorganic material. The substrate 10 may be formed of a composite structure of these materials. As the substrate 10, a substrate or a film formed of polyethyleneterephthalate (PET) may be used, for example. A flexible substrate formed of a polyimide resin may be used as the substrate 10. A tape used in a flexible printed circuit (FPC) or tape automated bonding (TAB) technology may be used as the flexible substrate. As examples of the substrate 10 formed of an inorganic material, a ceramic substrate and a glass substrate can be given. As an example of the composite structure of organic and inorganic materials, a glass epoxy substrate can be given.

The wiring board includes an interconnect pattern 12. The interconnect pattern 12 is formed on the substrate 10. The interconnect pattern 12 may be formed by attaching metal foil such as copper foil to the substrate 10 through an adhesive, and etching the metal foil after applying photolithography, for example. The interconnect pattern 12 may be formed by sputtering or the like. An additive method in which the interconnect pattern 12 is formed by electroless plating may be applied. The interconnect pattern 12 may be formed on one side or both sides of the substrate 10. In the case where the interconnect pattern 12 is formed on both sides of the substrate 10, the interconnect patterns 12 on both sides of the substrate 10 may be electrically connected through through-holes.

The interconnect pattern 12 includes a plurality of lands 20. An interconnect (line) (not shown) may be connected with each land 20. The lands 20 may be disposed on the substrate 10 in an area array, or may be formed only along the periphery of the substrate 10 at least in one line. The lands 20 may be formed on one side or both sides of the substrate 10.

Figure 1B:
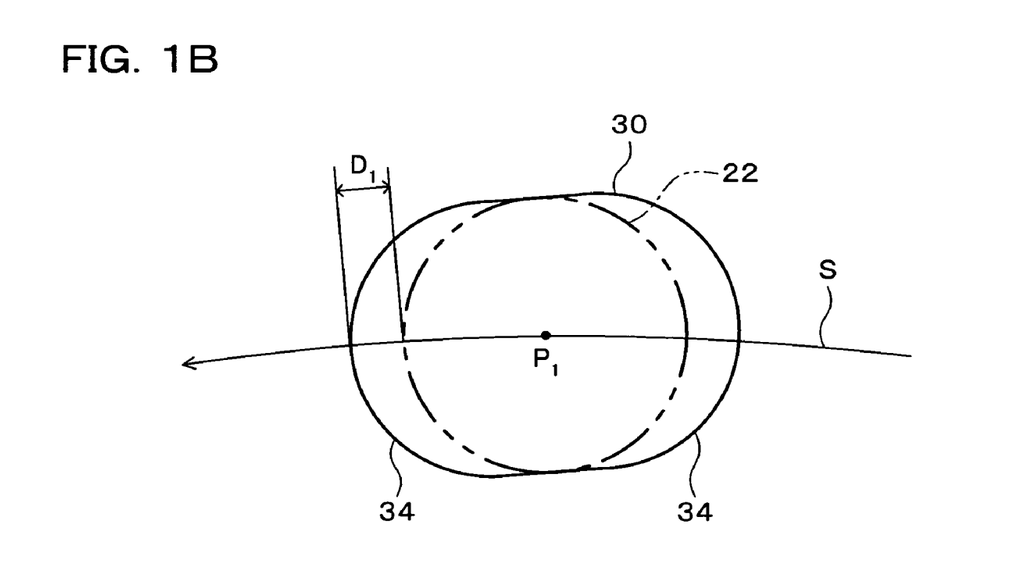
Figure 2B:
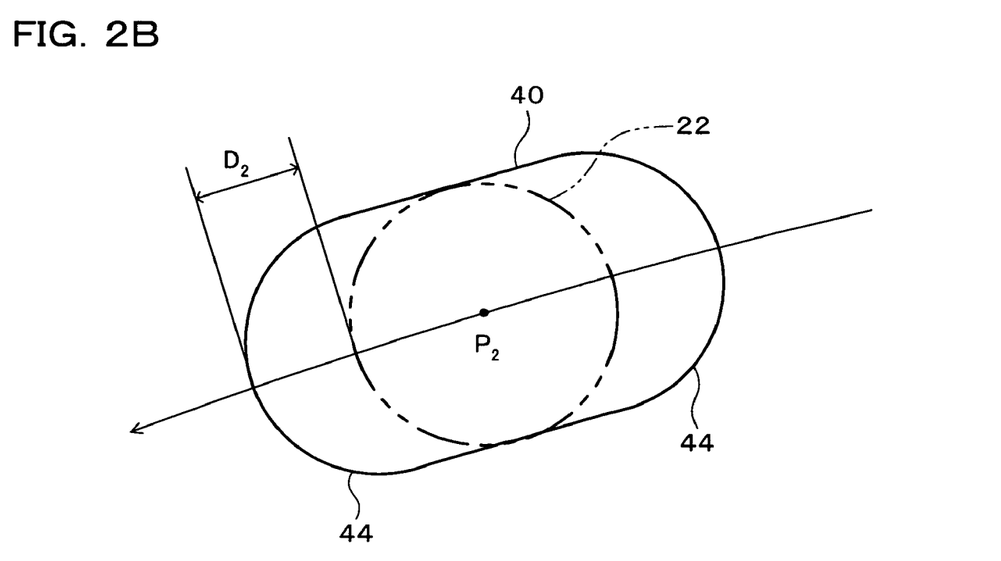

FIGS. 1B and 2B are enlarged views showing one of the lands 20. A land 30 (or 40), which is one of the lands 20, includes a base section 22 and an additional section 34 (or 44) extending from the base section 22. Each land 20 includes the base section 22 of the same shape. When a spiral curve S is rotated around the origin O and disposed to pass over the base section 22 (center of the base section 22, for example), the additional section 34 (or 44) is formed to extend from the base section 22 in the direction along the spiral curve S. The additional section 34 (or 44) may be formed on each side of the base section 22 along the spiral curve S (side which is closer to origin O and side which is away from origin O).

Figure 3:
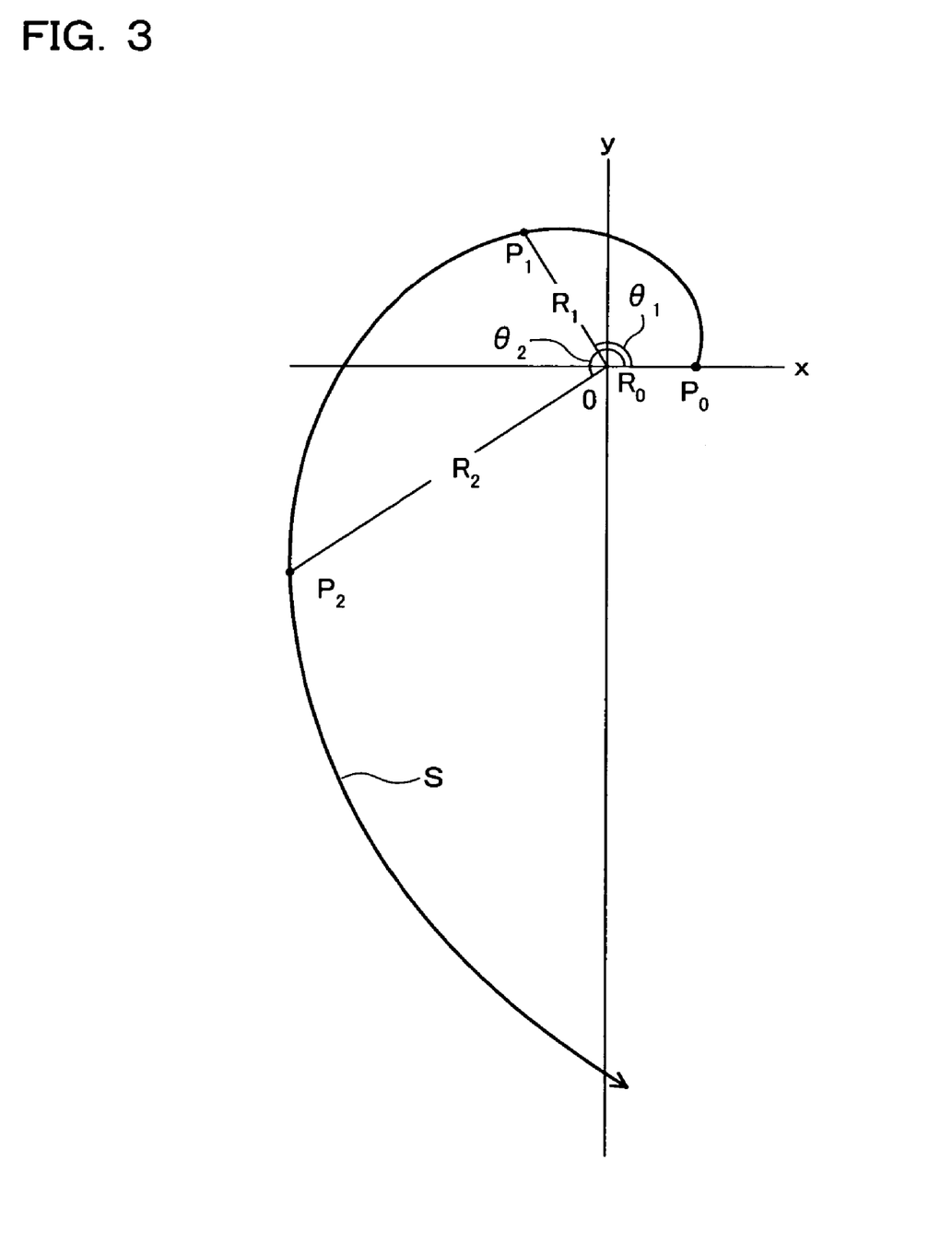
FIG. 3 is illustrative of a spiral curve.

FIG. 3 is illustrative of a spiral curve. The spiral curve S is drawn by rotating a moving point from the starting point $P_0$ around the origin O so that the distance from the origin O is proportional to the rotation angle. In more detail, the spiral curve S is drawn by rotating the moving point from the starting point $P_0$ so that the distance from the origin O becomes an exponential function in which the rotation angle is the exponent. The spiral curve S is expressed by the following equations, for example.

$$x = R_0 \cdot (R_{2\pi}/R_0)^{\theta/2\pi} \cdot \cos\theta$$

$$y = R_0 \cdot (R_2\pi/R_0)^{\theta/2\pi} \cdot \sin\theta$$

$R_0$: Distance between starting point $P_0$ and origin O $R_2\pi$: Distance between point $P_{2\pi}$ (not shown) and origin O when $\theta = 2\pi$ The additional section 34 (or 44) of the land 30 (or 40) has a length proportional to the rotation angle of the moving point from the starting point $P_o$. In more detail, the additional section of the land has a length which becomes an exponential function in which the rotation angle of the moving point from the starting point $P_0$ is the exponent. In the land 30 shown in FIG. 1B, the center of the base section 22 coincides with a point $P_1$ on the spiral curve S shown in FIG. 3 at a rotation angle of $\theta_1$. In the land 40 shown in FIG. 2B, the center of the base section 22 coincides with a point $P_2$ on the spiral curve S shown in FIG. 3 at a rotation angle of $\theta_2$. $\theta_2$ is greater than $\theta_1$, and a distance $R_1$ between the origin O and the point $P_1$ and a distance $R_2$ between the origin O and the point $P_2$ have a relationship expressed by $R_1 < R_2$. A length $D_1$ of the additional section 34 shown in FIG. 1B and a length $D_2$ of the additional section 44 shown in FIG. 2B have a relationship expressed by $D_1 < D_2$.

In the case where the substrate 10 isotropically expands or contracts due to the influence of humidity or heat, an arbitrary point on the substrate 10 moves along the spiral curve S. In the present embodiment, since the land 20 extends along the spiral curve S, the land 20 can be positioned with an electrode (or land) of an electronic part (semiconductor chip or wiring board, for example), even if the substrate 10 expands or contracts.

Figure 4A:
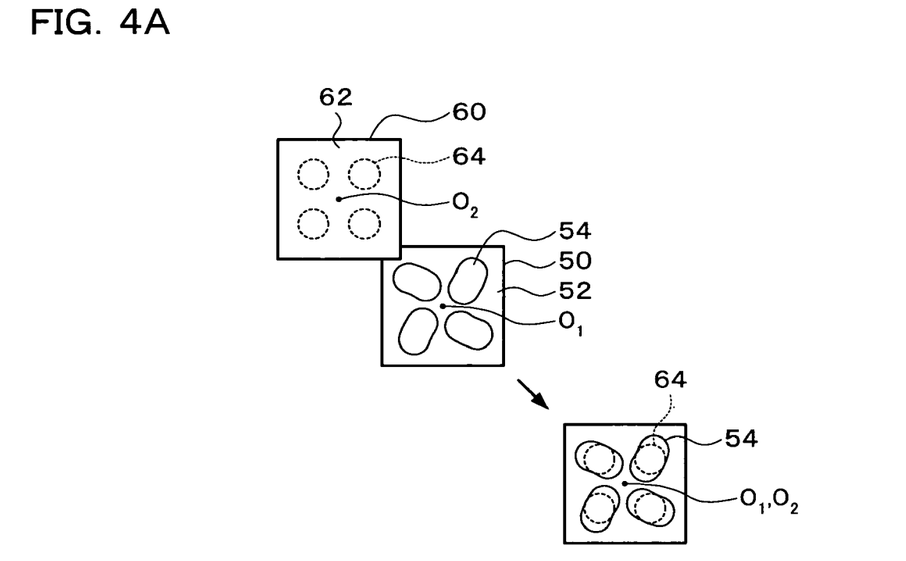
FIGS. 4A and 4B are illustrative of a positioning step of a wiring board according to an embodiment of the present invention and an electronic part.

FIGS. 4A and 4B are illustrative of a positioning step of the wiring board according to the embodiment of the present invention and an electronic part (semiconductor chip or wiring board, for example). FIG. 4A shows a wiring board 50 and an electronic part 60 (semiconductor chip or wiring board, for example). The wiring board 50 includes a substrate 52 and a land 54 to which the description of the substrate 10 and the land 20 is applied. The electronic part 60 includes a substrate 62 and an electrode 64 (or land). The lands 54 and the electrodes 64 are formed according to the same arrangement pattern on design. The wiring board 50 and the electronic part 60 are respectively provided with reference points $O_1$ and $O_2$ which coincide with the origin O shown in FIG. 1A or 2A on design. The reference points $O_1$ and $O_2$ may be indicated by visually recognizable marks, or may be points which can be calculated from other sections. When the reference points $O_1$ and $O_2$ are coincided, one of the land 54 and the electrode 64 (electrode 64, for example) is located inside the region of the other (land 54, for example).

Figure 4B:
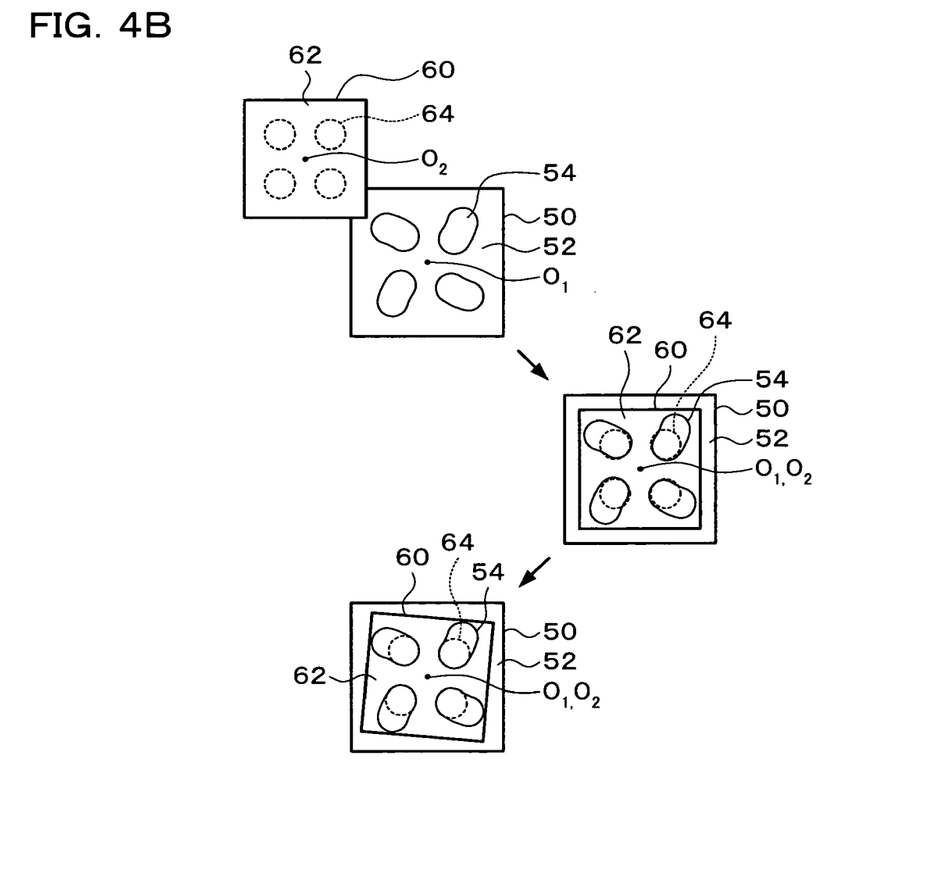

The wiring board 50 (substrate 52) and the electronic part 60 (substrate 62) may become relatively larger or smaller when at least one of the wiring board 50 and the electronic part 60 expands or contracts. FIG. 4B shows a state in which the substrate 52 of the wiring board 50 has expanded. The land 54 also moves accompanying expansion of the substrate 52. If the wiring board 50 and the electronic part 60 are disposed so that the reference points $O_1$ and $O_2$ are coincided in this state, the land 54 and the electrode 64 are not coincided. Therefore, the wiring board 50 (substrate 52) and the electronic part 60 (substrate 62) are relatively rotated around the origin O (coincided reference points $O_1$ and $O_2$). In more detail, one of the wiring board 50 and the electronic part 60 which has become relatively smaller (electronic part 60 (substrate 62)) is relatively rotated in the direction toward the origin O (coincided reference points $O_1$ and $O_2$) of the spiral curve S. This causes one of the land 54 and the electrode 64 (electrode 64, for example) to be located inside the region of the other (land 54, for example). Specifically, the wiring board 50 and the electronic part 60 (semiconductor chip or wiring board, for example) can be positioned.

Figure 5A:
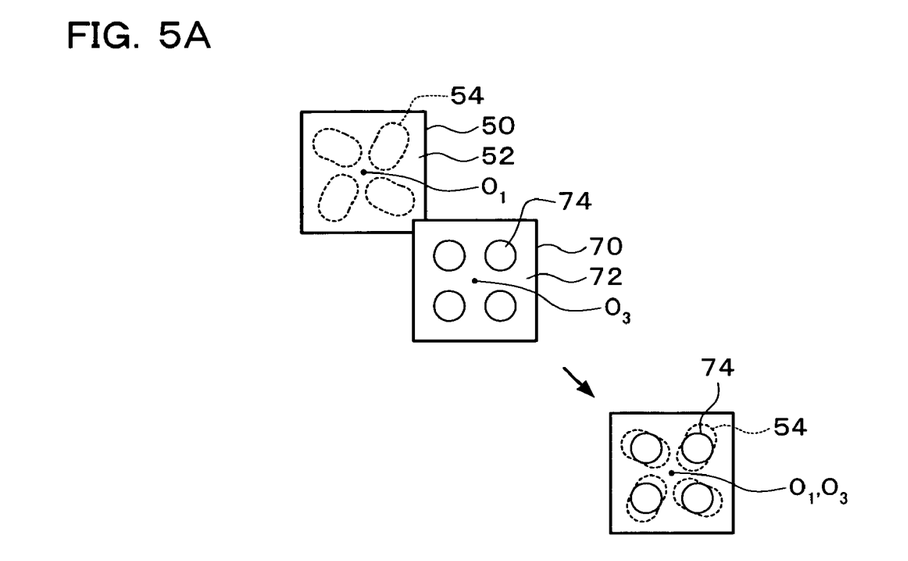
FIGS. 5A and 5B are illustrative of a positioning step of a wiring board according to an embodiment of the present invention and another wiring board.

FIGS. 5A and 5B are illustrative of a positioning step of the wiring board according to the embodiment of the present invention and another wiring board. FIG. 5A shows the wiring board 50 and a wiring board 70. The wiring board 50 includes the substrate 52 and the land 54 to which the description of the substrate 10 and the land 20 is applied. The wiring board 70 includes a substrate 72 and a land 74. The lands 54 and the lands 74 are formed according to the same arrangement pattern on design. The wiring board 50 and the wiring board 70 are respectively provided with the reference points $O_1$ and $O_3$ which coincide with the origin O shown in FIG. 1A or 2A on design. The reference points $O_1$ and $O_3$ may be indicated by visually recognizable marks, or may be points which can be calculated from other sections. When the reference points $O_1$ and $O_3$ are coincided, one of the land 54 and the land 74 (land 74, for example) is located inside the region of the other (land 54, for example).

Figure 5B:
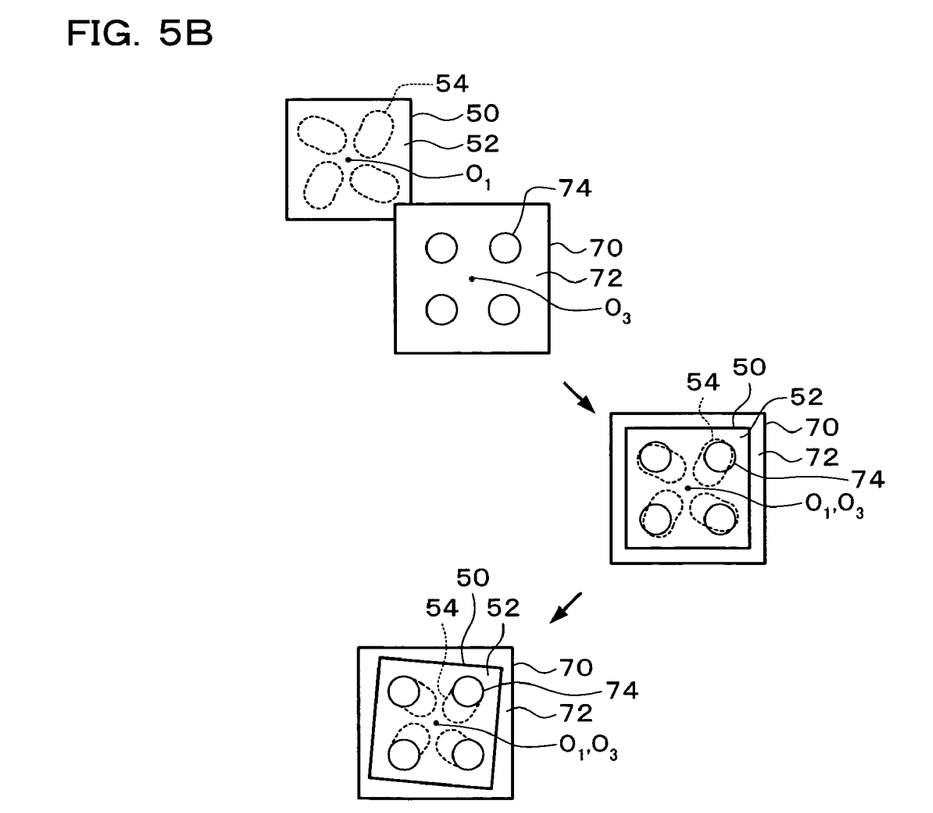

The wiring board 50 (substrate 52) and the wiring board 70 (substrate 72) may become relatively larger or smaller when at least one of the wiring board 50 and the wiring board 70 expands or contracts. FIG. 5B shows a state in which the substrate 72 of the wiring board 70 has expanded. The land 74 also moves accompanying expansion of the substrate 72. If the wiring board 50 and the wiring board 70 are disposed so that the reference points $O_1$ and $O_3$ are coincided in this state, the land 54 and the land 74 are not coincided. Therefore, the wiring board 50 and the wiring board 70 (substrate 72) are relatively rotated around the origin O (coincided reference points $O_1$ and $O_3$). In more detail, one of the wiring board 50 and the wiring board 70 which has become relatively smaller (wiring board 50 (substrate 52)) is relatively rotated in the direction toward the origin O (coincided reference points $O_1$ and $O_3$) of the spiral curve S. This causes one of the land 54 and the land 74 (land 74, for example) to be located inside the region of the other (land 54, for example). Specifically, the wiring board 50 and the wiring board 70 can be positioned.

Figure 6:
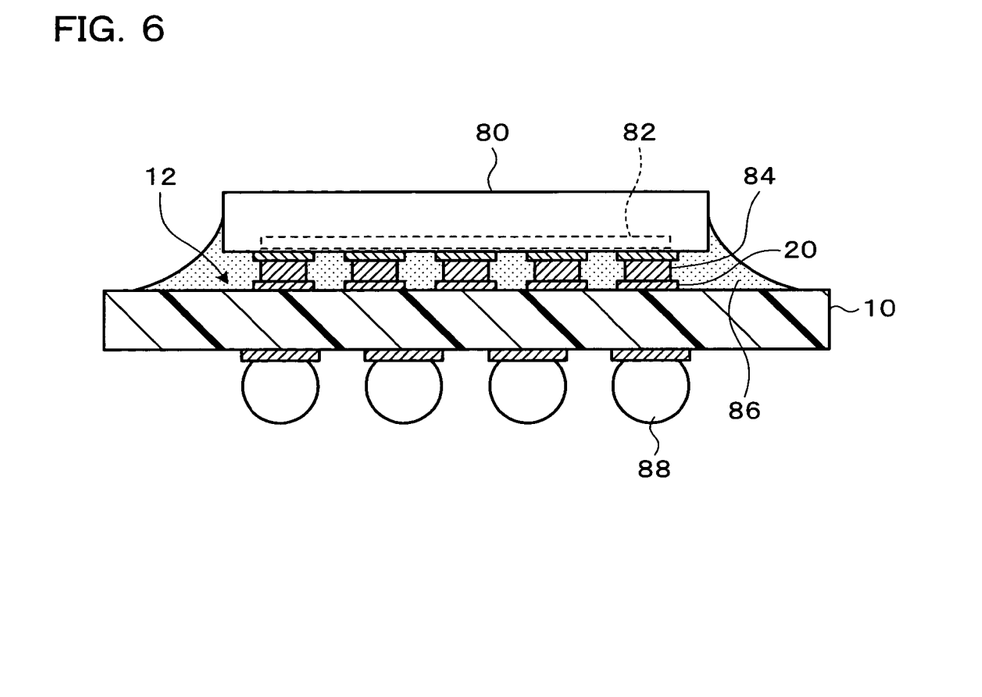
FIG. 6 is illustrative of a semiconductor device according to an embodiment of the present invention.

FIG. 6 is illustrative of a semiconductor device according to an embodiment of the present invention. The semiconductor device includes the substrate 10 shown in FIG. 1. The interconnect pattern 12 including the lands 20 is formed on the substrate 10 as described above. A semiconductor chip 80 is mounted on the substrate 10. An integrated circuit 82 is formed in the semiconductor chip 80, for example. The semiconductor chip 80 includes a plurality of electrodes 84. The electrode 84 may include a pad and a bump formed on the pad, or may include only a pad. The electrode 84 is electrically connected with the inside (integrated circuit 82, for example) of the semiconductor chip 80. The electrode 84 is electrically connected with one of the lands 20 face to face. The substrate 10 and the semiconductor chip 80 may be secured using an adhesive 86. The adhesive 86 may be an anisotropic conductive material (anisotropic conductive film or anisotropic conductive paste, for example). In this case, conductive particles may be present between the electrode 84 and the land 20. The semiconductor device may include an external terminal 88 (solder ball, for example). The external terminal 88 may be provided on the land formed on the substrate 10.

A method of manufacturing the semiconductor device includes a step of positioning the substrate 10 and the semiconductor chip 80 so that each of the lands 20 faces one of the electrodes 84. The description given with reference to FIGS. 4A and 4B applies to the details of this step. The method of manufacturing the semiconductor device includes a step of electrically connecting each of the lands 20 with one of the electrodes 84. An anisotropic conductive material (anisotropic conductive film or anisotropic conductive paste, for example), a metal junction, or pressure welding utilizing contraction force of the adhesive 86 may be used for achieving electrical connection.

According to the present embodiment, since the land 20 includes the additional section 34 (or 44) extending in the direction along the spiral curve S, even if the substrate 10 or the semiconductor chip 80 expands or contracts, the land 20 and the electrode 84 can be positioned by relatively rotating the substrate 10 and the semiconductor chip 80.

Figure 7:
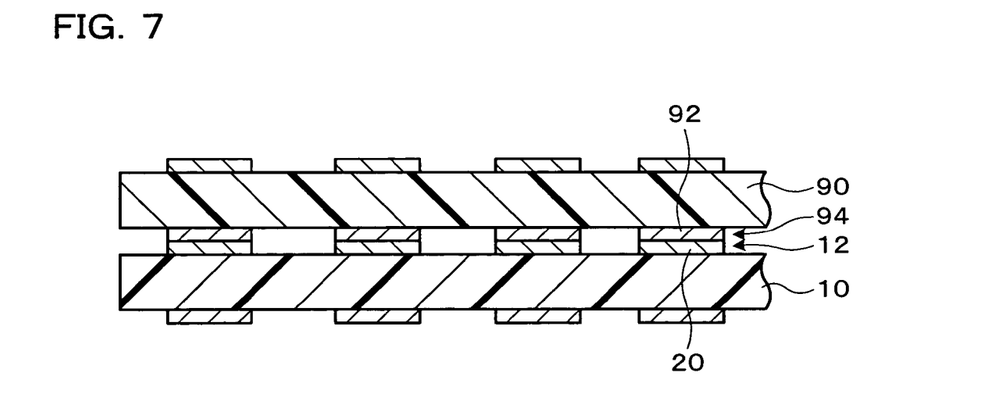
FIG. 7 is illustrative of a stacked wiring board according to an embodiment of the present invention.

FIG. 7 is illustrative of a stacked wiring board according to an embodiment of the present invention. The stacked wiring board includes a plurality of stacked substrates. An interconnect pattern is formed on each of the substrates. The substrates include the above-described substrate 10 (hereinafter called "first substrate") and a second substrate 90. The interconnect pattern 12 (hereinafter called "first interconnect pattern") including the lands 20 (hereinafter called "first lands") is formed on the first substrate 10. A second interconnect pattern 94 including second lands 92 is formed on the second substrate 90. Each of the first lands 20 is electrically connected with one of the second lands 92 face to face. The first and second substrates 10 and 90 may be secured using an adhesive (not shown). The adhesive may be an anisotropic conductive material (anisotropic conductive film or anisotropic conductive paste, for example). In this case, conductive particles may be present between the first and second lands 20 and 92.

A method of manufacturing the stacked wiring board includes a step of positioning the first and second substrates 10 and 90 so that each of the first lands 20 faces one of the second lands 92. The description given with reference to FIGS. 4A and 4B or FIGS. 5A and 5B applies to the details of this step. The method of manufacturing the stacked wiring board includes a step of electrically connecting each of the first lands 20 with one of the second lands 92. An anisotropic conductive material (anisotropic conductive film or anisotropic conductive paste, for example), a metal junction, or pressure welding utilizing contraction force of an adhesive may be used for achieving electrical connection.

Figure 8:
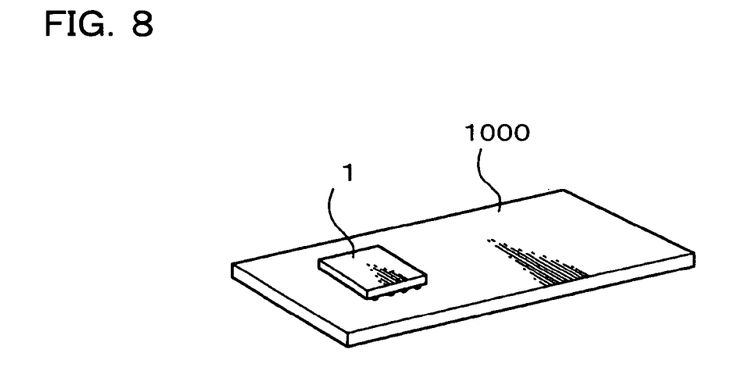
FIG. 8 is illustrative of a circuit board on which a semiconductor device according to an embodiment of the present invention is mounted.
Figure 9:
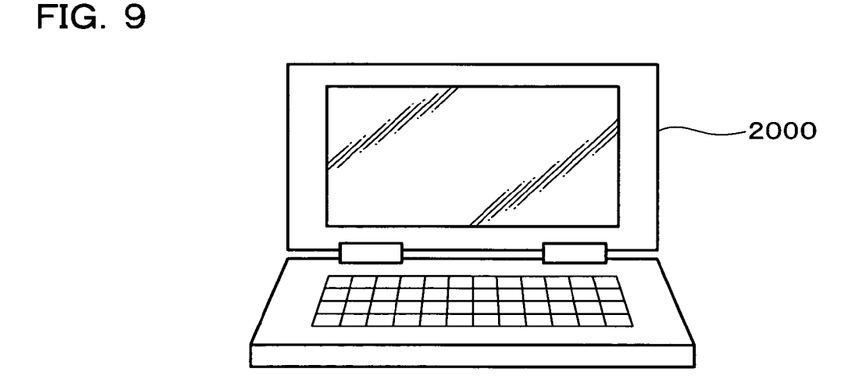
FIG. 9 shows an electronic instrument including a semiconductor device or a stacked wiring board according to an embodiment of the present invention.
Figure 10:
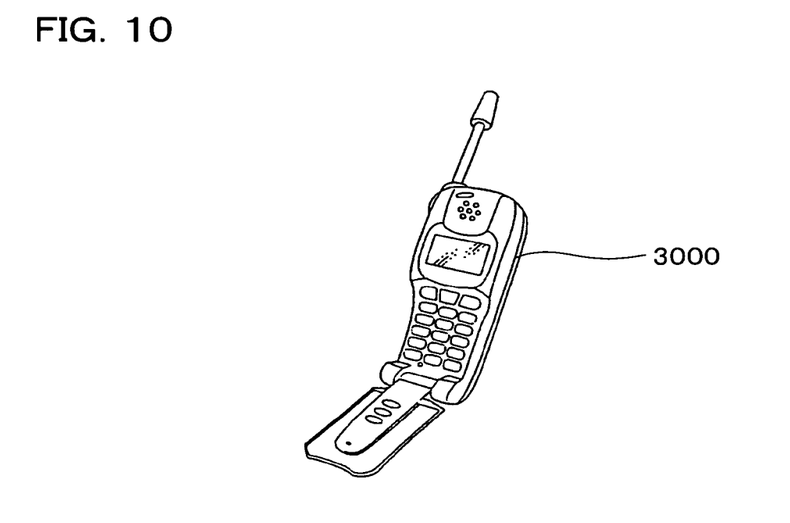
FIG. 10 shows another electronic instrument including a semiconductor device or a stacked wiring board according to an embodiment of the present invention.

FIG. 8 shows a circuit board 1000 on which a semiconductor device 1 according to the embodiment of the present invention is mounted. FIGS. 9 and 10 respectively show a notebook-type personal computer 2000 and a portable telephone 3000 as examples of electronic instruments including the semiconductor device or the stacked wiring board according to the embodiment of the present invention.

The present invention is not limited to the above-described embodiments. Various modifications and variations can be made. For example, the present invention includes configurations substantially the same as the configurations described in the embodiments (in function, in method and effect, or in objective and effect). The present invention also includes a configuration in which an unsubstantial portion in the above-described embodiments is replaced. The present invention also includes a configuration having the same effects as the configurations described in the embodiments, or a configuration capable of achieving the same objective. Further, the present invention includes a configuration in which a known technique is added to the configurations described in the embodiments.

What is claimed is:

1. A wiring board, comprising:
   a substrate; and
   an interconnect pattern formed on the substrate,
   wherein the interconnect pattern includes a plurality of lands,
   wherein each of the lands includes a base section and an additional section extending from the base section, the base section of each of the lands having the same shape, and
   wherein, when a spiral curve is rotated around an origin and disposed to pass over the base section, the additional section is formed to extend from the base section of any one of the lands in a direction along the spiral curve.

2. The wiring board as defined in claim 1,
   wherein the spiral curve is drawn by rotating a moving point from a starting point around the origin so that a distance from the origin is proportional to a rotation angle of the moving point from the starting point.

3. The wiring board as defined in claim 2,
   wherein the additional section of each of the lands has a length proportional to the rotation angle of the moving point from the starting point.

4. The wiring board as defined in claim 1,
   wherein the additional section is formed on each of two sides of the base section along the spiral curve.

5. A stacked wiring board, comprising:
   a plurality of stacked substrates; and
   a plurality of interconnect patterns formed on the plurality of substrates, respectively,
   wherein the plurality of substrates include first and second substrates,
   wherein the plurality of interconnect patterns include a first interconnect pattern which includes a plurality of first lands formed on the first substrate, and a second interconnect pattern which includes a plurality of second lands formed on the second substrate,
   wherein each of the first lands faces one of the second lands and is electrically connected with one of the second lands,
   wherein each of the first lands includes a base section and an additional section extending from the base section, the base section of each of the lands having the same shape, and wherein, when a spiral curve is rotated around an origin and disposed to pass over the base section, the additional section is formed to extend from the base section of any one of the first lands in a direction along the spiral curve.

6. The stacked wiring board as defined in claim 5, wherein the spiral curve is drawn by rotating a moving point from a starting point around the origin so that a distance from the origin is proportional to a rotation angle of the moving point from the starting point.

7. The stacked wiring board as defined in claim 6, wherein the additional section of each of the lands has a length proportional to the rotation angle of the moving point from the starting point.

8. The stacked wiring board as defined in claim 5, wherein the additional section is formed on each of two sides of the base section along the spiral curve.

9. An electronic instrument comprising the stacked wiring board as defined in claim 5.

10. A semiconductor device, comprising:
    a substrate on which an interconnect pattern including a plurality of lands is formed; and
    a semiconductor chip which is mounted on the substrate and includes a plurality of electrodes,
    wherein each of the electrodes faces one of the lands and is electrically connected with one of the lands,
    wherein each of the lands includes a base section and an additional section extending from the base section, the base section of each of the lands having the same shape, and
    wherein, when a spiral curve is rotated around an origin and disposed to pass over the base section, the additional section is formed to extend from the base section of any one of the lands in a direction along the spiral curve.

11. The semiconductor device as defined in claim 10, wherein the spiral curve is drawn by rotating a moving point from a starting point around the origin so that a distance from the origin is proportional to a rotation angle of the moving point from the starting point.

12. The semiconductor device as defined in claim 11, wherein the additional section of each of the lands has a length proportional to the rotation angle of the moving point from the starting point.

13. The semiconductor device as defined in claim 10, wherein the additional section is formed on each of two sides of the base section along the spiral curve.

14. A circuit board on which the semiconductor device as defined in claim 10 is mounted.

15. An electronic instrument comprising the semiconductor device as defined in claim 10.

16. A method of manufacturing a stacked wiring board, comprising:
    positioning a first substrate, on which a first interconnect pattern including a plurality of first lands is formed, and a second substrate, on which a second interconnect pattern including a plurality of second lands is formed, so that each of the first lands faces one of the second lands; and
    electrically connecting each of the first lands with one of the second lands,
    wherein each of the first lands includes a base section and an additional section extending from the base section, the base section of each of the lands having the same shape, and
    wherein, when a spiral curve is rotated around an origin and disposed to pass over the base section, the additional section is formed to extend from the base section of any one of the first lands in a direction along the spiral curve,
    wherein the base section of each of the first lands and each of the second lands are formed according to the same arrangement pattern on design,
    wherein the first and second substrates are provided with reference points which coincide with the origin on design, and
    wherein, in the step of positioning the first and second substrates, the first and second substrates are disposed so that the reference points coincide and relatively rotated around the origin.

17. The method of manufacturing a stacked wiring board as defined in claim 16,
    wherein, in the step of positioning the first and second substrates, the first and second substrates become relatively larger or smaller due to expansion or contraction of at least one of the first and second substrates, and one of the first and second substrates which has become relatively smaller is relatively rotated in a direction toward the origin of the spiral curve.

18. A method of manufacturing a semiconductor device, comprising:
    positioning a substrate, on which an interconnect pattern including a plurality of lands is formed, and a semiconductor chip including a plurality of electrodes so that each of the lands faces each of the electrodes; and
    electrically connecting each of the lands with one of the electrodes,
    wherein each of the lands includes a base section and an additional section extending from the base section, the base section of each of the lands having the same shape, and
    wherein, when a spiral curve is rotated around an origin and disposed to pass over the base section, the additional section is formed to extend from the base section of any one of the lands in a direction along the spiral curve,
    wherein the base section of each of the lands and each of the electrodes are formed according to the same arrangement pattern on design,
    wherein the substrate and the semiconductor chip are provided with reference points which coincide with the origin on design, and
    wherein, in the step of positioning the substrate and the semiconductor chip, the substrate and the semiconductor chip are disposed so that the reference points coincide, and relatively rotated around the origin.

19. The method of manufacturing a stacked wiring board as defined in claim 18,
    wherein, in the step of positioning the substrate and the semiconductor chip, the substrate and the semiconductor chip become relatively larger or smaller due to expansion or contraction of at least one of the first and second substrates, and one of the first and second substrates which has become relatively smaller is relatively rotated in a direction toward the origin of the spiral curve.

* * * * *